(12) United States Patent
Alexander

(10) Patent No.: US 6,522,345 B1
(45) Date of Patent: Feb. 18, 2003

(54) SYSTEM AND METHOD FOR SIMULTANEOUSLY INVOKING AUTOMATED MEASUREMENTS IN A SIGNAL MEASUREMENT SYSTEM

(75) Inventor: Jay A. Alexander, Monument, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/005,746

(22) Filed: Jan. 12, 1998

(51) Int. Cl.$^7$ ................................................. G09G 5/00
(52) U.S. Cl. ...................... 345/771; 345/440; 345/970; 702/68
(58) Field of Search ................................ 345/134, 339, 345/340, 348, 349, 967, 970, 764, 771, 810, 835, 843, 961, 440.1, 440; 702/64, 66–68, 79, 124

(56) References Cited

U.S. PATENT DOCUMENTS 5,081,592 A * 1/1992 Jenq ............................. 702/68
5,579,462 A * 11/1996 Barber et al. ................ 345/440
5,953,009 A * 9/1999 Alexander ................... 345/771

OTHER PUBLICATIONS

Tektronix TDS684A, TDS744A & TDS784A Digitizing Oscilloscopes User Manual (1994).*

Lajeunesse, D. ("Making your job easier with a DSO", Electronics Now, Dec. 1996, pp. 30–32).*

* cited by examiner

Primary Examiner—Sy D. Luu

(57) ABSTRACT

A quick measurement apparatus and method for invoking automated measurements in a signal measurement system. The system sequentially applies one or more predetermined automated measurements to each of a plurality of predetermined waveforms. The automated measurements, which are applied to each of the user-selected waveforms in response to a single respective measurement request, measure a respective predetermined extent of each of the selected waveforms. Preferably, each single respective activation request is generated in response to the performance of an associated single operator action. It is also preferable that the system is configured to enable a user to define the sequence in which the automatic measurements are applied to the selected waveforms. The signal measurement system further includes a graphical user interface for displaying the waveforms and the measurement results. Each of the measurement requests is generated in response to a corresponding selection of a display element on the graphical user interface. Alternatively, the signal measurement system also includes a front panel keyboard. Here, each of the respective operator actions includes a depression of a dedicated button on the signal measurement system front panel. Each depression of the dedicated button invokes one of the measurement requests.

18 Claims, 7 Drawing Sheets

SYSTEM AND METHOD FOR SIMULTANEOUSLY INVOKING AUTOMATED MEASUREMENTS IN A SIGNAL MEASUREMENT SYSTEM

BACKGROUND OF THE INVENTION

1. Field of the Invention

The present invention relates generally to signal measurement systems and, more particularly, to simultaneously invoking automated measurements in a signal measurement system.

2. Related Art

Conventional signal measurement systems such as digital oscilloscopes sample, record and display time-varying analog signals. Samples of an input signal are taken and quantized, and the resultant digital representations are stored in a waveform memory under the control of a sampling clock. The acquired data may be subsequently read out as locations in memory are sequentially addressed by a clock signal to provide digital data which can be converted to a time-varying output signal for a waveform display. The sampling clock may be operated at one of several selectable rates depending upon the frequency content of the input signal. The selection of the portion of the analog input signal which is sampled and stored is determined by appropriate triggering circuitry to enable the operator to display the desired portion of the waveform.

There are many types of display elements which can be presented in signal measurement systems in general and test and measurement instruments in particular. For example, in addition to the waveforms representing the signals currently received at the channel inputs, waveforms referred to as function waveforms may also be displayed. Function waveforms are waveforms created by processing one or more signal waveforms. Such processing may include, for example, performing arithmetic manipulations on a signal waveform or combining multiple input signal waveforms in some predetermined manner. The resulting function waveforms are stored in a display memory for subsequent retrieval and display. In addition, memory waveforms may also be displayed. Memory waveforms are waveforms which have been previously captured and stored in a memory device of the signal measurement system. In addition to the above waveforms, other display elements such as marker indicators, trigger indicators, etc., are typically displayed.

A primary function provided by signal measurement systems in the analysis of signals is to enable an operator to perform an automated measurement of a desired signal parameter. Automated measurements allow an operator to quickly and accurately determine values of key attributes of acquired signals without the use of manual calculations. Automated measurements are also a useful and productive technique for characterizing electrical signals using common, well-understood quantities such as peak-to-peak voltage, rise time and frequency. In addition, automated measurements are often used to verify that a given circuit or hardware component as satisfies established performance specifications.

To invoke an automated measurement of a signal waveform displayed in a conventional signal measurement system, a number of operator actions are typically required to be performed. These include the performance of one or more actions to select a desired measurement, followed by additional actions to identify a waveform on which to perform the measurement, referred to herein as the source waveform. In addition to associating the selected measurement with a selected waveform, additional information often needs to be specified. This information may include, for example, the portion or extent of the source waveform over which the selected measurement is to be applied. This extent most often corresponds to a certain time period of the source waveform.

Conventional techniques for invoking oscilloscope measurements often involve the use of push-button keys on the instrument's front panel. A measurement is selected by depressing a dedicated key with the associated measurement's name printed on or above it. A source waveform is subsequently identified, either by pressing a key associated with a particular channel, or by turning a knob that scrolls through a list of possible sources.

In another conventional approach, the desired measurement is selected by pressing a multifunction 'softkey' having a currently-assigned function of invoking a given measurement. Typically, the softkey is located near a textual or graphical display whereat the key's current function is displayed. With this approach, the current function of the softkey must first be assigned through the activation of a 'menu' or 'setup' key. The menu/setup key may be a fixed function key located on the front panel, or may itself be a softkey having a currently-assigned function of assigning functions to one or more other softkeys. In such conventional systems, source waveform selection is typically accomplished with still additional softkey operations. In other conventional instruments, a hybrid solution is employed. For example, in one conventional approach, measurement selection is accomplished with fixed functions keys while source waveform selection is performed using softkeys.

As noted, in addition to selecting the measurement and source waveform, oftentimes a specific region of the source waveform must be selected by the user. Typically, this is achieved by the operator selecting a desired horizontal extent of the source waveform for measurement. For example, an individual pulse among a series of pulses may need to be selected to measure the period of the signal. Conventional signal measurement systems employ several different methods to select a specific waveform extent or region. In one conventional approach, measurements are applied to the first cycle of the displayed waveform beginning with the left-most pulse. In these systems, the horizontal position controls must be adjusted by the user so that the pulse of interest appears at the left-most position on the waveform display prior to invoking the measurement on the waveform.

In other conventional approaches, a set of marker indicators (visual lines with adjustable vertical and horizontal positions) must be activated and positioned such that the markers bound the region of the source waveform to be measured. Yet another technique is to eliminate the need for region selection by adjusting both horizontal scale and position and, perhaps, the trigger specification, such that only the pulse of interest appears on the waveform display.

There are a number of drawbacks to these latter conventional approaches. First, these conventional techniques require multiple key presses and/or knob turns to be implemented in a specified sequence in order to properly invoke a measurement. Not only is such an arrangement difficult to understand and operate, considerable time is consumed performing the requisite steps to obtain a desired measurement. This is particularly problematic when a number of measurements are to be performed on different regions of many waveforms. Moreover, the it requirement to select a region or horizontal extent often places additional sequencing constraints on the overall invocation process. Common to many implementations of conventional systems is the requirement that the identification of the waveform region must be performed prior to selection of the measurement. Thus, these conventional approaches require both the source waveform and waveform region to be identified prior to the selection of the automated measurement. This is often counter-intuitive to the typical user who most often wants to choose the measurement first, then apply the measurement to a certain extent of a certain displayed waveform.

A further drawback to the above conventional approaches is the limited indications provided to the user with instructions and feedback. For example, certain measurements are only applicable to certain types of waveforms. Conventional systems typically provide no indications to notify a user whenever an attempted application of a particular measurement to a particular waveform is incorrect. As a result, the user may navigate through a significant series of softkey layers to select the source waveform, manipulate various knobs to identify the region to measure, and then again navigate among a number of softkeys to select the measurement. It is not until after these operations are performed that a determination is made as to whether an allowable waveform/measurement assignment has been requested. As a result, the user must periodically repeat a significant number of operator actions to invoke a proper measurement on a desired waveform.

These drawbacks are particularly burdensome when the operator is to invoke a number of measurements either on the same or different source waveforms. For example, an operator may need to measure the same signal parameters of multiple waveforms or may need to perform a series of measurements of specific characteristics of a selected waveform which together provide a desired characterization of the waveform. To perform such a series of measurements in conventional systems, very complex procedures must be performed to successively select particular waveforms, waveform regions and measurements. As a result, these systems are time consuming to use and difficult for the novice or infrequent user to operate and understand.

In addition, performing multiple measurements of multiple waveforms requires a large number of operator actions to be performed. To perform several automated measurements on multiple waveforms, conventional signal measurement systems generally require an operator to perform the series of actions described above to invoke each automated measurement on each waveform. As a result, to perform several automated measurements on several waveforms, the number of operator actions significantly increases. For example, if 5 operator actions are required to invoke each of 4 desired automated measurements and 3 active waveforms are to be measured, an operator would be required to perform 60 (5×4×3=60) separate actions to invoke each of the desired automated measurement on each of the selected waveforms.

One conventional approach to simultaneously invoking multiple measurements is provided in the Model TDS 500, TDS 600 and TDS 700 series oscilloscopes available from Tektronix, Inc. Although this feature, referred to as the "Snapshot" feature, enables an operator to invoke multiple measurements, there are a number of drawbacks to this technique which make it impractical in many applications. To begin with, the Tektronix Snapshot feature suffers from the above-noted drawbacks associated with the use of softkeys. Multiple operator actions are required to be performed in a specified sequence in order to properly invoke a Snapshot measurement. In addition, the operator must select the desired source waveform through the performance of still additional softkey operations. As noted, not only is such an arrangement difficult to understand and operate, considerable time is consumed performing the requisite steps to obtain desired measurements.

Another drawback to the Tektronix Snapshot feature is that the measurement results are presented to the operator in a display window that covers a substantial portion of the waveform display, obscuring the waveforms which are being studied. To enable the operator to visualize the results of subsequent operations, the system removes the results display window from the display whenever an operator input is detected. Thus, to preserve; the results of the automated measurements before proceeding to other tasks, an operator must either manually record or print the measurement results. Otherwise, the operator must reinvoke the measurements after the additional tasks or operations are completed. A further significant drawback to this approach is that it prevents the user from being able to visually associate the waveform and measurement results.

Additional drawbacks relate to the static nature of the Tektronix Snapshot feature. Invocation of the feature results in the performance of the measurements only once; waveform dynamics are not reflected in the displayed measurement results. Thus, the operator must continually re-invoke the automated measurements in order to obtain updated measurement results. In addition to requiring the operator to refresh the automated measurements for known dynamic changes in the waveform, this system fails to alert the operator to unknown dynamic changes in the displayed waveform, allowing the operator to assume previously obtained measurement results are currently valid.

What is needed, therefore, is a simple, intuitive system for performing automated measurements of waveforms regardless of the skill level of the operator. Such a system should also enable operators to invoke user-selected measurements in an efficient manner, and allow the operator to customize the application of such measurements to desired waveforms.

SUMMARY OF THE INVENTION

The present invention is a quick measurement apparatus and method for invoking automated measurements in a signal measurement system. In one aspect of the invention, the quick measurement system is configured to apply one or more predetermined automated measurements to each of a plurality of predetermined waveforms sequentially. The multiple measurements are applied to each of the user-selected waveforms in response to a single respective measurement request. The automated measurements measure a respective predetermined extent of each of the selected waveforms. Preferably, each respective measurement request is generated in response to the performance of an associated single operator action. It is also preferable that the quick measurement system is configured to enable a user to define the sequence in which the automatic measurements are applied to the selected waveforms.

In one embodiment, the signal measurement system further includes a graphical user interface for displaying the waveforms and the measurement results on a signal measurement system display. In this embodiment, each of the measurement requests is generated in response to a corresponding selection of a display element on the graphical user interface. In another embodiment, the signal measurement system also includes a front panel keyboard. In this embodiment, each of the respective operator actions includes a depression of a dedicated button on the signal measurement system front panel. Each depression of the dedicated button invokes one of the measurement requests.

In another embodiment, the display includes a waveform display region for displaying the plurality of waveforms, and a measurement display region for displaying the measurement results. The measurement display region is configured so as to not overlay or otherwise interfere with the display of the waveforms in the waveform display region.

In another aspect of the invention, a quick measurement system for use in a signal measurement system having a display is disclosed. The quick measurement system is configured to simultaneously apply a plurality of user-selected automated measurements to each of a plurality of user-selected waveforms in a predetermined sequence. Each application of the plurality of automated measurements occurs in response to a single measurement request. In one embodiment, the signal measurement system includes a graphical user interface. Here, the measurement request is generated in response to operator -selection of a display item on the graphical user interface, such as a pull-down menu item or an icon. In other embodiments, the signal measurement system includes a control panel. In these embodiments, the measurement request is generated in response to a depression of a dedicated button on the control panel or a selection of a programmable softkey on the measurement system display. Alternatively, the measurement request is automatically generated, for example at power on of the signal measurement system.

In another aspect of the invention, a method for sequentially applying one or more predetermined automated measurements to a plurality of predetermined waveforms in a signal measurement system having a display is disclosed. The method includes the steps of: (a) receiving a measurement request; (b) applying the one or more predetermined automated measurements to one of a plurality of the predetermined waveforms corresponding to the measurement request; (c) displaying results of step (b) in a specified region of the display proximate to displayed waveforms; and (d) repeating steps (a) through (c) until all of the one or more predetermined automatic measurements are applied to each of the predetermined waveforms in a predetermined sequence. In one embodiment, the method also includes a step prior to step (a) of determining the predetermined automated measurements. In another embodiment, the method also includes a step prior to step (a) of determining the predetermined waveforms.

In another aspect of the invention, a signal measurement system is disclosed. The signal measurement system includes a signal acquisition system; a display; and a quick measurement system. The quick measurement system includes a measurement manager configured to sequentially apply a plurality of automated measurements to each of a plurality of waveforms in accordance with predetermined measurement parameters. Each of the measurement applications occurs in response to a measurement request, and results in a display of measurement results. The quick measurement system also includes an automated measurement customizer configured to enable an operator to select the plurality of automated measurements and, preferably, the predetermined measurement parameters, In one embodiment, the signal measurement system also includes a graphical user interface for displaying the waveforms and measurement results on a display of the signal measurement system. Preferably, each of the measurement requests is generated in response to a corresponding selection of a display element on the graphical user interface. In an alternative embodiment, the signal measurement system also includes a front panel keyboard. In this embodiment, each measurement request is generated in response to a single respective operator action. In this embodiment, the operator action is a depression of a dedicated button on the signal measurement system front panel. Preferably, the quick measurement system customizer is also configured to enable a user to define a sequence in which the automatic measurements are applied to the multiple waveforms; that is, the relative sequence in which the source waveforms are measured.

One advantage of the present invention is that only a limited knowledge of the signal measurement system, measurement parameters and measurement invocation procedures is required. As a result, a novice or inexperienced user simply may invoke automated measurements through the activation of a single front panel button or graphical user interface display element. This also eliminates the need for the operator to navigate through graphical user interface menus, softkey menus, dialog boxes, or other features which is time consuming and may also not be familiar to the novice or infrequent user.

Another advantage is that the present invention enables the operator to invoke multiple measurements with the generation of a single measurement request, significantly minimizing the number of operator actions, and complexity of the system. Furthermore, these automated measurements may be applied to multiple waveforms in a predetermined sequence, each application occurring in response to a single operator action. As a result, the operator may select only specific waveforms of interest and simultaneously apply multiple measurements to each of the waveforms in sequence, advancing through all of the selected waveforms in succession quickly and easily.

A further advantage is that the quick measure system enables the operator to customize the invocation of automated measurements, including the quantity and type of measurements which are to be performed, as well as which specific waveforms are to be measured. As a result, the quick measurement system may be customized to satisfy any measurement need of the operator.

Further features and advantages of the present invention as well as the structure and operation of various embodiments of the present invention are described in detail below with reference to the accompanying drawings. In the drawings, like reference numerals indicate identical or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

Figure 1:
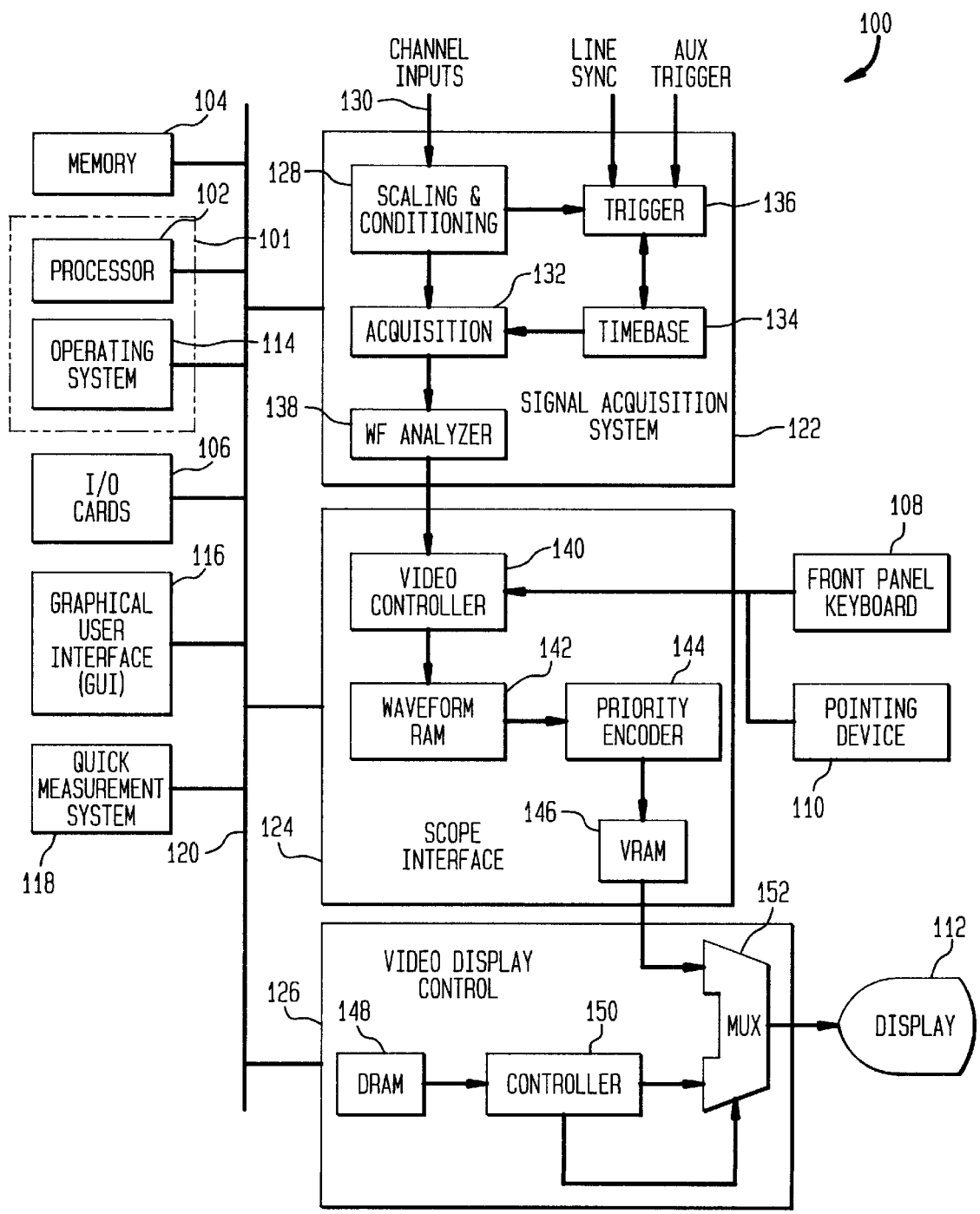
FIG. 1 is a functional block diagram of a digital oscilloscope suitable for implementing the quick measurement system of the present invention.

The present invention is an apparatus and method for simultaneously applying a plurality of automated measurements to a predetermined plurality of waveforms in a desired sequence, with each application occurring in response to a simple operator action. The present invention, hereafter referred to as a quick measurement system, may be implemented in any signal measurement system. In one preferred embodiment of the present invention, the quick measurement system is implemented in a test and measurement instrument, such as a digital or analog oscilloscope, logic analyzer, network analyzer or spectrum analyzer. FIG. 1 is a functional block diagram of an exemplary digital oscilloscope suitable for implementing the quick measurement system of the present invention.

The digital oscilloscope 100 is a commonly-available digital oscilloscope designed to acquire, analyze and display a wide variety of signals generally in terms of the voltage of the signals versus time. The digital oscilloscope 100 preferably includes a general purpose computer system which is programmable using a high level computer programming language, and specially-programmed, special purpose hardware for performing signal acquisition, analysis and display functions.

The digital oscilloscope 100 includes a processor 102, a memory unit 104, input/output (I/O) interface cards 106, storage units (not shown) such as a hard disk drive and a floppy disk drive, display 112, and one or more input devices such as front keyboard panel 108 and pointing devices 110. The memory 104 is used for storage of program instructions and for storage of results of calculations performed by the processor 102. In a preferred embodiment, the memory 104 includes random access memory (RAM). The display is preferably a liquid crystal display and is logically or physically divided into an array of picture elements(pixels). The input/output (I/O) interface cards 106 may be modem cards, network interface cards, sound cards, etc.

The processor 102 is typically a commercially available processor, such as the Pentium microprocessor from Intel Corporation, PowerPC microprocessor, SPARC processor, PA-RISC processor or 68000 series microprocessor. Many other processors are also available. Such a processor usually executes a program referred to as an operating system 114, such as the various versions of the Windows operating systems from Microsoft Corporation, the NetWare operating system available from Novell, Inc., or the Unix operating system available from many vendors such as Sun Microsystems, Inc., Hewlett-Packard and AT&T. The operating system 114 controls the execution of other computer programs such as a graphical user interface (GUI) 116 and the quick measurement system, 118 of the present invention, and provides scheduling, input-output control, file and data management, memory management, and communication control and related services. The processor 102 and operating system 114 define a computer platform shown by dashes block 101, for which application programs in high level programming languages are written. The functional elements of the digital oscilloscope 100 communicate with each other via bus 120.

The digital oscilloscope 100 includes a signal acquisition system 122, a scope interface 124 and video controller 126. The signal acquisition system 122 includes scaling and conditioning 128 that receives input signals through channel inputs 130. The scaling and conditioning unit 128 and acquisition unit 132 include well-known high frequency electronics for signal acquisition, signal conditioning, and analog-to-digital conversion, all of which are controlled by the computer system 101 and are considered to be well-known in the art. The timebase 134 drives the analog-to-digital conversion process performed in acquisition 132, specifying when to sample the input signals and how many samples are to be taken. The trigger 136 synchronizes the acquisition process through the timebase 134, enabling an operator to arrange a trigger event to obtain a stable waveform display of the desired features of one or more of the input signals. Trigger 136 may be based upon a line sync or auxiliary trigger input, as is well known in the art.

The waveform analyzer 138 performs measurement processes for developing the waveform for display. It contains hardware and software to perform well-known operations such as setting the analog-to-digital codes for the acquisition unit 132 and mapping the resulting digital information to the physical pixel locations which are ultimately presented on display 112 under the control of GUI 116. The pointing device 110 and/or the keyboard 108 are used to move a cursor on the GUI-controlled display 112 to select display elements under the cursor. The pointing devices 110 may include any number of pointing devices such as a mouse, trackball or joy stick. Of course, the cursor may be controlled with one or more keyboards 108 located externally or integrated into a front panel of the digital oscilloscope 100.

The scope interface card 124 includes a video controller 140 that controls the rendering of pixels into the waveform random access memory (RAM) 142. It also receives display element control commands and cursor input information from the front panel keyboard 108 and the pointing device(s) 110. The waveform RAM 142 includes a data structure for each pixel location on the display 112. The data structures contain information regarding every display element that is to be drawn at each pixel location. Although there may be multiple display elements which are to be drawn at a given pixel location, only one color may be rendered at that location. The waveform RAM 142 supplies the priority encoder 144 with this information. The priority encoder 144 prioritizes the competing display elements. For example, if an operator arranged a marker and a waveform such that they are located in the same pixel location, then the priority encoder 144 selects that display element with a highest predetermined priority. In such an example, the color of the marker is rendered at the pixel location providing a display that appears to show the marker over the waveform. The priority encoder then sends the selected color to the VRAM 146 which then causes the pixel to be rendered in the indicated color.

The video display controller 126 includes a dynamic random access memory (DRAM) 148 which contains data specifying a color for each pixel in the display 112. Likewise, the video random access memory (VRAM) 146 also contains data specifying a color for each pixel in the display 112. The computer system 101 controls the information in DRAM 148 while the signal acquisition system 122 controls information in the VRAM 146. For each pixel in the display 112, the video controller 126 selects whether the pixel in the display 112 is specified from VRAM 146 or DRAM 148. In general, information in VRAM 146 includes digitized waveforms being generated by the system 122 with high rates of change that are much too fast for software processing by the computer system 101 for real-time display of the waveforms on display 112.

Video controller 126 includes a controller 150 and a multiplexer 152. Controller 150 controls which of the two inputs to the multiplexer 152 are processed into display signals for transmission to the display 112 under the control of the graphical user interface 116. The controller 150 typically monitors color data sent from the DRAM 148 and may be programmed to switch the multiplexer 152 to a different input when a particular programmed color is received from the DRAM 148. A rectangular pixel area is typically defined within DRAM 148 with the programmed color, typically dark gray. The programmed color is not displayed, but instead serves as a data path switch control for the multiplexer 152. Therefore, within the programmed color rectangle, display data comes from VRAM 146. When various control functions are needed, an interactive dialog box is drawn within the programmed color rectangle.

The quick measurement system 118 is a simple and intuitive apparatus and associated methodology that enables an operator to sequentially apply multiple automated measurements to many source waveforms. The automated measurements and the waveforms are preferably selected by the user/operator. The selected measurements are sequentially applied to the waveforms in a predetermined sequence. Preferably, the sequence in which the waveform (referred to herein as source waveforms) are measured is also user-definable. Each application of the multiple measurements to a single waveform occurs in response to a single measurement request which, in turn, may be generated in response to a simple operator action. The operator actions may be, for example, the depression of a single dedicated button located on the front panel keyboard 108 or the selection of an icon or menu item displayed on display 112 through the graphical user interface 116. Each of such operator actions generates a single measurement request to which the quick measurement system 118 is responsive. Preferably, the same operator action is performed to apply the measurements to each source waveform. In such an embodiment, each operator action is sequentially associated with the application of the predetermined measurements to a particular source waveform. Preferably, the same operator action is also associated with the clearing of all-measurements. Thus, the user/operator may advance the application of the measurements through the source waveforms sequentially, followed by a resetting of measurement results, all with the repeated performance of the same operator action.

In one embodiment, the quick measurement system 118 is implemented in software routines which interoperate with the components of the signal measurement system 100 to perform the quick measurement functions in accordance with the present invention. Such software routines typically reside in memory 104 and/or disk storage devices, and may be stored on any other computer-readable medium such as, for example, magnetic disk, compact disc or magnetic tape, and may be loaded into the digital oscilloscope 100 using an appropriate peripheral device as known in the art. Preferably, this embodiment of the quick measurement system 118 is implemented in any well-known functional or object-oriented programming language such as C or C++. Those skilled in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. The quick measurement system may be implemented, for example, in dedicated hardware, firmware, or any combination thereof.

Figure 2A:
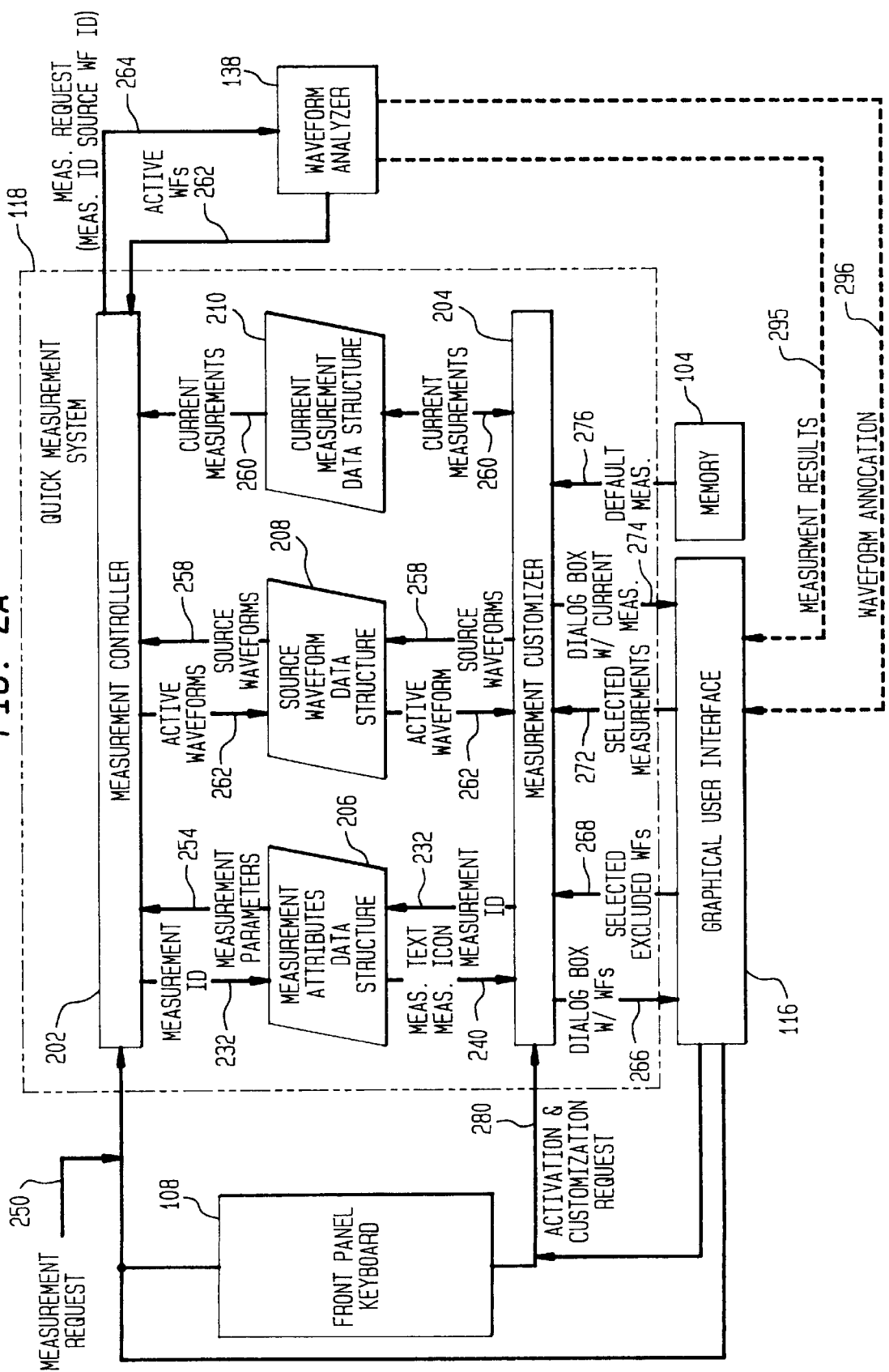
FIG. 2A is a functional block diagram of one embodiment of the quick measurement system implemented in the digital oscilloscope illustrated in FIG. 1.
Figure 2B:
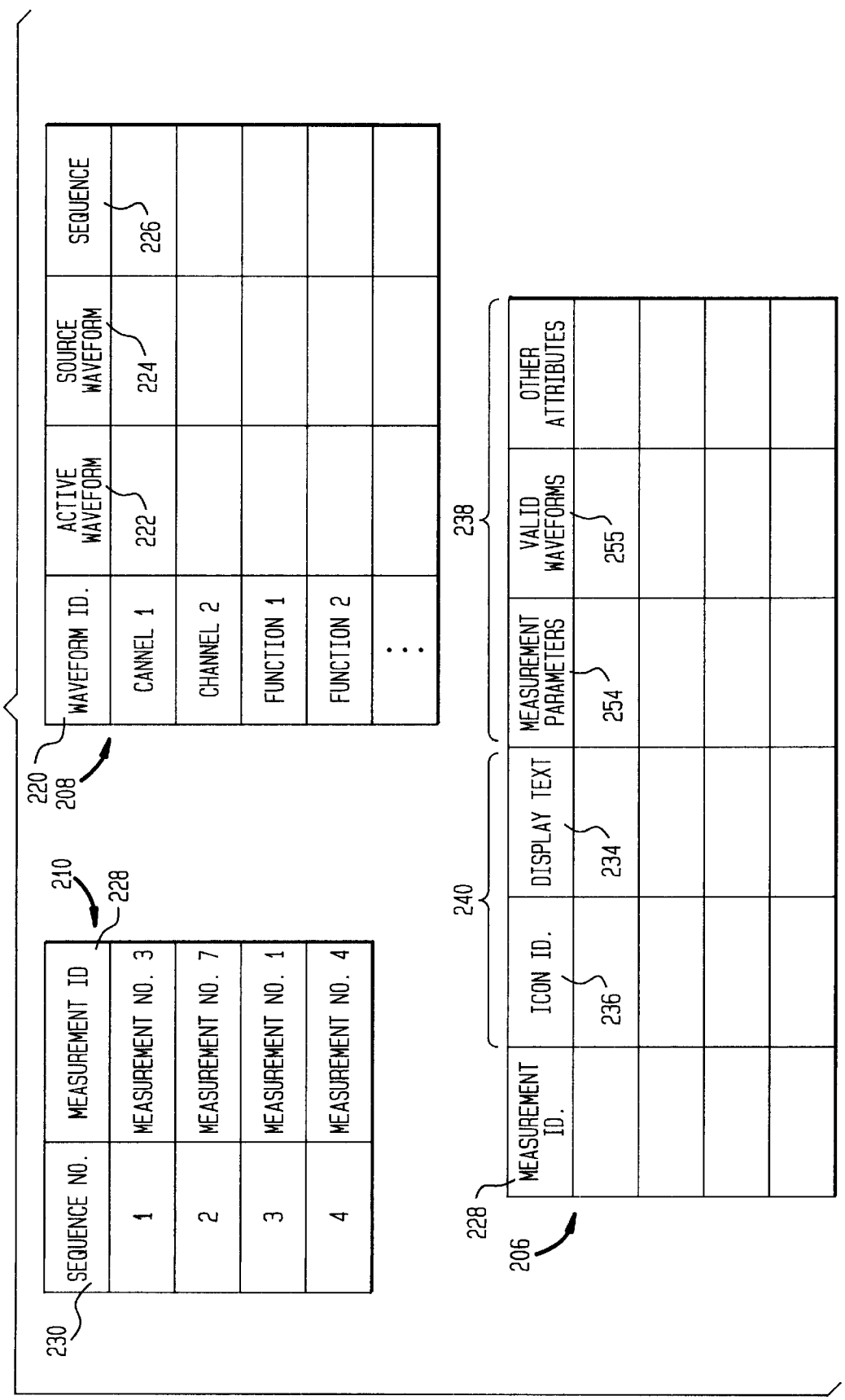
FIG. 2B is an illustration of one embodiment of the data structures created and utilized by the quick measurement system illustrated in FIG. 2A.

A preferred implementation of the quick measurement system 118 is in test and measurement equipment having a control panel keyboard such as front panel 108, and/or a graphical user interface 116. A functional block diagram of one preferred embodiment of the quick measurement system 118 of the present invention implemented in the digital oscilloscope 100 is shown in FIG. 2A. The data structures created and accessed by this embodiment of the quick measurement system 118 are illustrated in detail in FIG. 2B. The function and operation of the quick measurement system 118 will be described with reference to FIGS. 2A and 2B, and an exemplary measurement results display 300 illustrated in FIG. 3 which is displayed on display 112 using the graphical user interface 116.

The measurement results display 300 in the graphical user interface 116 includes a waveform display region 302 and a measurement results display region 304 generated in accordance with the present invention. A number of information and control menus are also displayed on the graphical user interface 300. For example, a channel status display region 314 is displayed, preferably at the periphery of the waveform display region 302. In the illustrative example shown in FIG. 3, a single waveform is displayed in the display region 302. Specifically, a channel 1 waveform 306 is shown in the channel status display region 314.

Referring to FIG. 2A, the quick measurement system 118 primarily includes a measurement controller 202 and a measurement customizer 204. The measurement controller 202 applies one or more predetermined automated measurements to one or more desired source waveforms. The measurement controller 202 applies the measurements to the source waveforms in accordance with a predetermined sequence and in response to a measurement request 250 generated in response to an associated operator action. The measurement customizer 204 enables the user/operator to modify the current automated measurements which are to be applied to the source waveforms. In addition, the measurement customizer 204 preferably enables the user/operator to select and modify the source waveforms which are to be measured by the quick measurement system 118. The measurement customizer 204 is also preferably configured to enable the user/operator to modify the sequence in which the source waveforms are measured. As shown in FIG. 2A and described in detail in FIG. 2B, the quick measurement system 118 includes a number of data structures 206, 208 and 210 in which waveform and measurement data is passed between the measurement controller 202 and measurement customizer 204.

A source waveform data structure 208 is used in the illustrative embodiment of the present invention to identify which of the currently active waveforms in the host instrument have been selected by the user/operator to be measured. The source waveform data structure 208 is constructed and arranged to store a waveform ID 220 for each of the waveforms which may be monitored by the system 100, along with an indication 222 of whether the waveform is currently being monitored by the system 100; that is, whether the waveform is currently active. The source waveform data structure 208 also includes an indication 224 identifying which of the active waveforms are to be measured; that is, which are source waveforms. In a preferred embodiment, the source waveform data structure 208 also includes a sequence number 226 identifying the sequence in which the source waveforms are to be measured.

As shown in FIG. 2A and as described below, the measurement controller 202 accesses the source waveform data structure 208 to retrieve the waveform identifiers 220 identifying the source waveforms 258 which are to be measured in a current implementation of the quick measurement system 118. As noted, the source waveform data structure 208 includes an indication 222 of which waveforms are currently active in the signal measurement system 100. The measurement controller 202 sets the active indication 222 in the source waveform data structure 208 to identify the active waveforms. This is shown in FIG. 2A as active waveforms 262 generated by measurement controller 202. This information is obtained from the waveform analyzer 138 as shown by the active waveforms 262 being retrieved from the waveform analyzer 138 by the measurement controller 202.

The measurement customizer 204 updates the source waveform data structure 208 to indicate which of the active waveforms were selected as the source waveforms 258 to be measured by the quick measurement system 118. Since the quick measurement system 118 cannot measure waveforms which are not active (that is, not currently captured or displayed by the signal measurement system 100), in one embodiment the user is provided with only active waveforms 262 from which to select the source waveforms 258. Accordingly, the active waveforms 262 are retrieved from the source waveform data structure 208. As noted, the active waveforms 262 include the waveform ID 220 of those waveforms for which the active indication 222 indicating that the waveform is currently being captured or displayed by the system 100. Alternatively, the user/operator may be provided with a list of all possible waveforms from which the user may exclude waveforms from eligibility for quick measurement rotation. In this embodiment, such waveforms are displayed, but not measured by the present invention. For example, in a system where there are numerous active waveforms, the user may a priori exclude those waveforms which are not of interest.

A current measurement data structure 210 is used in the illustrated embodiment of the present invention to identify the measurements which have been selected by the user/operator to apply to the source waveforms 258, referred to as the current measurements 260. The current measurement data structure 210 includes the measurement IDs 228 for each of the automated measurements which are currently selected to be applied to the source waveforms 258. Stored with each measurement ID 228 is a sequence number 230 that indicates the sequence in which the measurement is applied to each source waveform 258 relative to the other current measurements 260. Thus, in the current measurement data structure 210 illustrated in FIG. 2B, there are four measurements which are to be applied to the source waveforms 258. The first measurement is the measurement that has a measurement ID 228 of 3; the second measurement is the measurement having a measurement ID 228 of 7; the third measurement, measurement ID 228 of 1; and the fourth measurement, measurement ID 228 of 4.

The measurement customizer 204 accesses the current measurement data structure 210 to provide the user with the current measurements 260 which will be applied to the source waveforms 258, and to modify the current measurements 260 in accordance with the user/operator's selections. The current measurements 260 are provided to the measurement controller 202 for application to the source waveforms 258 as described below.

The measurement attributes data structure 206 includes measurement attributes for each of the measurements. The measurement attribute data structure contains a measurement ID (index) 228, a measurement name (display text) 234, an icon ID 236,;and attributes 238 of each measurement function. The attributes 238 include, for-example, whether the measurement is a waveform-specific measurement, and if so, which types of waveforms to which the measurement may be applied. For example, some measurements operate on FFT waveforms while others, such as rise time, cannot. The attributes 238 also include the number of required source waveforms and whether the measurement function is edge-sensitive. It should be understood that other attributes 238 may be included. The measurement controller 202 retrieves measurement parameters 254 by accessing the measurement attributes data structure 206 with the measurement ID 228. The measurement customizer 204 also accesses the measurement attributes data structure 206 with the measurement ID 228. As will be described, the measurement customizer 204 retrieves the measurement text and, preferably, measurement icon location or ID 240. This information is used by the customizer 204 to provide the user with text and visual indications for easy identification of the measurements.

The measurement attributes data structure 206, source waveform data structure 208, and current measurement data structure 210, are accessed in any well-known manner by the measurement controller 202 and measurement customizer 204. In addition, the information contents of the data structures 206, 208 and 210 may be embodied in any appropriate data structure, such a table, linked list, etc.

The measurement controller 202 determines the active waveforms 262 by accessing the waveform analyzer 138 in a well-known manner. The measurement controller 202 updates the source waveform data structure 208 with the active waveforms 262 as noted above. The a measurement customizer 204 also updates the source waveform data structure 208 with the source waveforms 258. Preferably, the measurement customizer 204 selects default or initial source waveforms 258 to write to the source waveform data structure 208. Upon receipt of a measurement request 250, the measurement controller 202 determines the source waveforms 258 and applies the current measurements 260 from the current measurement data structure 210 to the source waveforms 258 in the source waveform data structure 208.

The measurement request 250 is preferably generated in response to a simple operator action. In one preferred embodiment, the measurement request 250 is generated in response to the activation of a dedicated switch, button or softkey on the front panel keyboard 108. This is shown as the measurement request 250 emanating from the front panel keyboard 108 in FIG. 2A. As one skilled in the relevant art would find apparent, an interface module is typically interposed between the front panel keyboard 108 and the other portions of the signal measurement system 100. Such a module performs well-known operations to provide an interface with the front panel 108, and is not shown in FIG. 2A for clarity.

In another preferred embodiment, the activation request 250 is generated in response to the selection of a display element on the graphical user interface 116. As used herein, the term "display element" refers to any selectable item that may be displayed on display 112 by a graphical user interface 116. This is shown in FIG. 2A as the graphical user interface 116 generating the same measurement request 250. It should be understood that the generation of the measurement request 250 may be provided by either or both, the front panel keyboard 108 and the graphical user interface 116. In an alternative embodiment, the measurement request 250 is generated automatically by the signal measurement system 100, such as at the time the signal measurement system is initially powered.

The measurement controller 202 associates each measurement request 250 with a corresponding source waveform 258. That is, the measurement controller 202 applies the current measurements 260 to one source waveform 258 in response to the receipt of an associated measurement request 250. For example, receipt of the first measurement request 250 may result in the application of the current measurements 260 to the waveform having a sequence number 226 of 1 in the source waveform measurement data structure 208. Likewise, upon receipt of the next measurement request 250, the measurement controller 202 will apply the current measurements 260 to the source waveform 258 having a sequence number 226 of 2 in the source waveform data structure 208. In other words, the measurement controller 202 associates the measurement requests 250 with the source waveforms 258 which are to be measured. Alternatively, the measurement controller 202 may associate different requests 250 with the application of the current measurements 260 to the source waveforms 258. For example, a rotatable dial may be provided on the front panel keyboard 108 having various switch positions. Each switch position may be associated with a particular source waveform 258. In such an embodiment, rotation of the knob to that particular switch setting will cause the generation of an associated measurement request, causing the measurement controller 202 to apply the current measurements 260 to the associated source waveform 258. In one preferred embodiment, the graphical user interface 116 displays an interactive dialog box through which the user/operator may select one of a series of display buttons each being associated with a particular source waveform. In the same manner as noted above, the measurement controller 202 will apply the current measurements to the source waveform associated with the selected display element.

In a particular embodiment, the measurement request 250 is generated in response to the depression of a dedicated button on the front panel keyboard 108. In this embodiment, the to measurement controller 202 sequentially associates the measurement requests 250 with the source waveforms 258. As a result, the user/operator may repeatedly depress and release the dedicated button to cause the quick measurement system 118 to successively apply the current measurements 260 to each source waveform 258 according to the sequence 226 in the source waveform data structure 208. Repeated depressions of the dedicated button causes the quick measurement system 118 to cycle through the entire sequence of source waveforms 258 in this manner. As noted, in a preferred embodiment, one of the measurement requests 250 is sequentially associated with the clearing of all measurements and the resetting of measurement results (that is, an "off" state). In this embodiment, the repeated depressions of the dedicated button will cause the quick measurement system 118 to eventually enter the off state after sequentially applying the current measurements 260 to all of the source waveforms 258. Thus, a user/operator can control the application of measurements in the quick measurement system 118 to numerous source waveforms 258 simply by depressing and releasing a single dedicated button on the front panel keyboard 108. This enables the quick measurement system 118 to be utilized by a novice user/operator.

The measurement controller 202 invokes each of the automated measurements 260 on a source waveform 258 in accordance with the measurement parameters 254. The measurement controller 202 retrieves the measurement ID 228 for the current measurements 260 and uses the measurement ID 228 as an index into the measurement attributes data structure 206 to retrieve the measurement parameters 254. The measurement controller 202 applies the current measurements 260 to the source waveforms 258 identified in the source waveform data structure 208, through the generation of a measurement request 264 to the waveform analyzer 138. The measurement request 264 includes the measurement ID 228 for the current measurement which is being applied, and the waveform ID 220 of the source waveform 258 to be measured. The waveform analyzer 138 returns the measurement results 295 and, preferably, waveform annotation display request 296 to the graphical user interface 116 through the VRAM 146. This indirect path is illustrated by dashed lines in FIG. 2A. The waveform analyzer 138 preferably places the measurement results in the transparent region 304 of the waveform display region 302. Alternatively, the measurement results 295 and waveform annotation 296 may be returned to the measurement controller 202 which will then present them to the user in a region of the graphical user interface 300 which does not interfere with the user's view of the displayed waveforms.

Certain measurements must be performed on a particular extent or region of the source waveform 258, such as frequency, rise-time and fall-time measurements. This edge-sensitivity of any automated measurement is recorded in the measurement attributes data structure 206. Consequently, the measurement controller 202 contains information regarding the edge-sensitivity of any measurement it invokes as part of its measurement parameters 254, as discussed above. The measurement controller 202 provides the waveform analyzer 138 with an indication of whether the current measurement is edge-sensitive through the measurement request 264. The waveform analyzer 138 automatically selects an appropriate extent of the source waveform for measurement. In one preferred embodiment of the present invention, the waveform analyzer 138 automatically selects the left-most extent of the waveform displayed in the waveform display region 302.

Preferably, the extent or region of the source waveform 258 which is measured and the displayed measurement results are symbolically associated with each other with annotations. Annotations enable the user/operator to easily associate the selected measurement, the results 295 of that measurement and the location on the source waveform 258 where the measurement is being applied. The resulting measurement display preferably includes a textual description of the measurement function, the numeric results of the measurement and the annotated symbol to cross-reference with the source waveform to clearly identify the location at which the measurement function was applied.

The measurement customizer 204 is activated or invoked upon receipt of an activation and customization request 280. As shown in FIG. 2A, the request 280 may be provided from the front panel keyboard 108 and/or the graphical user interface 116. The generation of the by activation and customization request 280 is preferably in response to a simple operator action such as those described above with reference to the measurement request 250. As noted, the measurement customizer 204 is configured to enable the user/operator to modify the current measurements 260, the source waveforms 258 and, preferably, the sequence in which the current measurements 260 are applied to the source waveforms 258. These operations are preferably performed by the user/operator using graphical user interface 116. The graphical user interface 116 generates the measurement/source waveform customization request 280 which is received by the measurement customizer 204. The request 280 is referred to as the activation and customization request 280 in the current discussion to illustrate that the quick measurement system 118 may be both activated and customized in response to the same request or command. For example, upon the first receipt of the request 280, the quick measurement system 118 may be invoked and automatically perform the customization functions described herein. Should the quick measurement system 118 currently be operating, then the receipt of a request 280 will cause the customization operations to commence. Numerous variations and combinations are possible and considered to be within the scope of the present invention.

Figure 3:
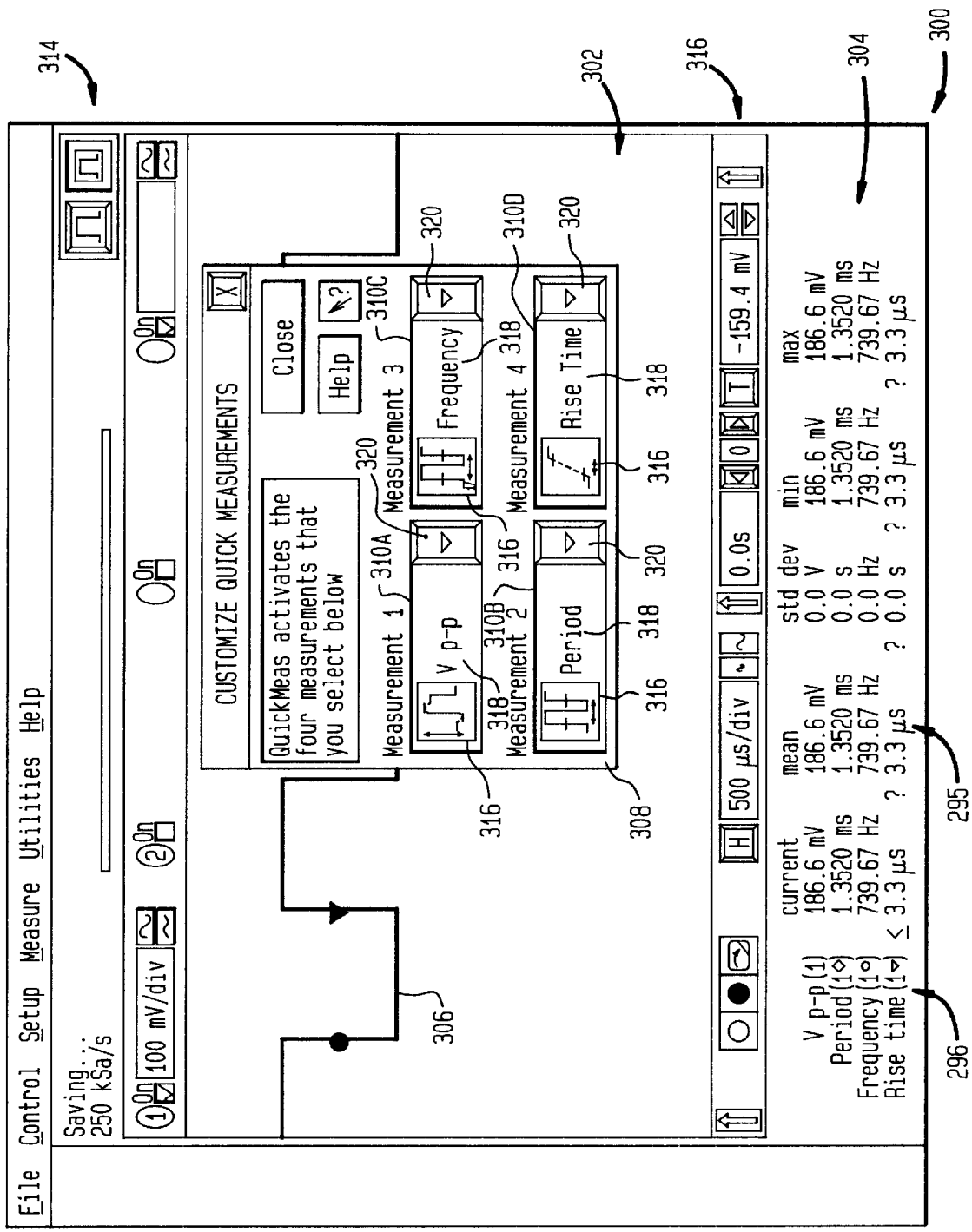
FIG. 3 is an illustration of a graphical user interface displayed in accordance with one embodiment of the present invention.

The measurement customizer 204 generates an interactive dialog box appropriate to the request. If the user/operator indicates that the current measurements 260 are to be modified, then the measurement customizer 204 generates a command 274 to the graphical user interface 116 to generate an interactive dialog box, referred to as the customize quick measurements dialog box. This dialog box includes the measurement text 234 and, preferably, the icon identified by the icon ID 236 of the current measurements 260. As noted, the measurement customizer 204 uses the measurement IDs 228 from the current measurement data structure 210 as an index into the measurement attribute data structure 206 to retrieve the measurement text 234 and measurement icon ID 236. This information is provided to the graphical user interface 116 as part of the command 274 to create the customize quick measurement dialog box. An exemplary customize quick measurement dialog box 308 is shown in FIG. 3. As will be described below, the user/operator may select from all available measurements the desired measurements which are to be applied to the source waveforms 258. This information is provided to the measurement customizer 204 through the graphical user interface 116. Such transfer of information is represented in FIG. 2A as selective measurements command 272. The measurement customizer 204 then updates the current measurement data structure 210 with the selected measurements as described above. As noted, the measurement customizer 204 may initially establish the current measurements through the retrieval of default measurements 276 retrieved from the memory 104.

In one preferred embodiment, the user/operator may modify-the source waveforms 258. In this embodiment, when the user/operator indicates that the source waveforms 258 are to be modified, then the measurement customizer 204 generates a command 266 requesting the graphical user interface 116 to generate a source waveform interactive dialog box. As noted, the measurement customizer 204 retrieves the source waveforms 258 from the source waveform data structure 208. Once the user/operator has modified or selected the desired source waveforms through the graphical user interface 116, the information is provided to the customizer 104, as represented by a selected waveforms command 268. The measurement customizer 204 then updates the source waveform data structure 208 with the selected source waveforms received from the graphical user interface 116, as described above. As noted, in one preferred embodiment, all of the waveforms are provided to the user/operator for selection of those waveforms, which when active, will not be measured by the quick measurement system 118. Such an embodiment is particularly useful when there are numerous possible active waveforms that may be displayed in the system 100.

Prior to applying each current measurement 260 to each of the source waveforms 258, the measurement controller 202 determines-whether the source waveform 258 is correctly scaled and is an appropriate waveform to be measured by the current measurement 260 based upon the valid waveforms 255 provided in the measurement attribute data structure 206. If there is an invalid measurement/waveform association, the measurement controller 202 notifies the user/operator through the graphical user interface 116 that the measurement on the selected waveform cannot be performed. In one preferred embodiment, this is indicated in the measurement results display region 304 by providing some textual indication rather than the numeric results of the measurements. Also, the measurement controller 202 periodically performs the current measurements on all of the source waveforms, providing the user/operator with an indication of the dynamic changes in the source waveforms. Preferably, the periodicity is user-selected, such as through the measurement dialog box 308.

FIG. 3 is an exemplary embodiment of one display 300 on the graphical user interface 116 introduced above. As noted, the signal measurement system 100 preferably includes a graphical user interface 116 which provides an interactive graphical environment for which the user can visualize and control various features of the signal measuring system 100, including the quick measurement system 118.

As noted, the graphical user interface 116 provides a waveform display region 302 and a measurement results display region 304. The illustrated waveform 306 shown in the waveform display region 302 may be a channel, function, memory or any other type of waveform. The measurement results display region 304 provide the measurement results from the application of the current measurements 260 on the source waveforms 258. In the illustrative embodiment, the source waveforms 258 include waveform 306.

As shown in FIG. 3, the display region 302 is preferably separated from the measurement results display region 304 by some visual indication. In the illustrative embodiment shown in FIG. 3, this separator is a display element status bar 316. As a result, the measurement results which are displayed in the region 304 do not clutter or distract from the waveform display in the display region 302.

In the illustrative embodiment, the interactive dialog box 308 introduced above is illustrated in FIG. 3. For each measurement which may be modified by the user/operator, the interactive dialog box 308 presents a measurement control region 310 within the dialog box 308. In the illustrative embodiment, four such measurement control regions 310A–310D are shown. This indicates that the illustrative quick measurement system 118 illustrated in FIG. 2A applies four current measurements 260 to each of the source waveforms 258 in succession. It should be understood that the quick measurement system 118 may apply measurements which are not modifiable by the user/operator, and thus are not provided a measurement control region 310 in the interactive dialog box 308. It should be further noted that more or less measurements may be modified in alternative embodiments, up to the total number of measurements available in the signal measurement system 100.

Each measurement control region 310 displays one of the current measurements 260 and is configured to enable the user/operator to change the measurements. As shown in FIG. 3, each measurement control region 310 preferably also includes both, an icon 316 that graphically illustrating the measurement to be performed, as well as a textual description 318 of the measurement. Thus, there are preferably visual and textual indications provided to the user/operator.

To replace the current measurement shown in the measurement control region 310, the user selects the menu invocation button 320 included in each measurement control region 310. Selection of the button 320 invokes the display of a drop down list from which the user may selected a different measurement. The selected measurement will then appear in the text display region 318, along with a visual icon of the measurement. The use of icons to represent the measurements enables the user/operator to equate functions with visual display elements over time, integrating the graphical user interface 116 into the operation and function of the implementing signal measurement system 100. Such display/selection options are well-known in the art. This may be performed for all of the modifiable measurements provided in the interactive dialog box 308. Upon completion, the user may close the dialog box 308, causing the measurement customizer 204 to update the data structure 210. It should be understood that various verification operations may be performed during the user/operator modifications or after the dialog box is closed. For example, one of the selections for-each of the measurements may be "no measurement." If all measurements are selected as "no measurement" then the system may prompt the user/operator to verify that such a selection is intentional. Alternatively, the customizer 204 could prevent the user from selecting the same measurement for more than one of the displayed measurements. Such processes may be implemented by comparing the measurement IDs of the selected measurement with each other in any well known manner. Other types restrictions, verifications or limitations may-be incorporated into the measurement customizer 204 as would be apparent to one skilled in the art.

As noted, the measurement display window 300 also includes a measurement results display region 304. In the illustrative embodiment illustrated in FIG. 3, there is a single source waveform 306 displayed in the waveform display region 302. The measurement results region 304 includes the measurement results for the four measurements displayed in the dialog box 308. That is, the volts (peak-to-peak), period, frequency and rise time measurement results are displayed in the results region 304.

Also, the measurement controller 302 preferably annotates the displayed waveform 306 and the waveform extent which has been measured by a particular measurement with a symbol. The same symbol is provided in the measurement results display region 304 to enable the user/operator to visually associate the measured waveform and the results of that measurements. Thus, as shown in FIG. 3, the rise time measurement is represented by a triangle, which indicates that the measurement is applied to the first rising edge of the displayed waveform 306, as shown in the waveform display region 302.

Figure 4:
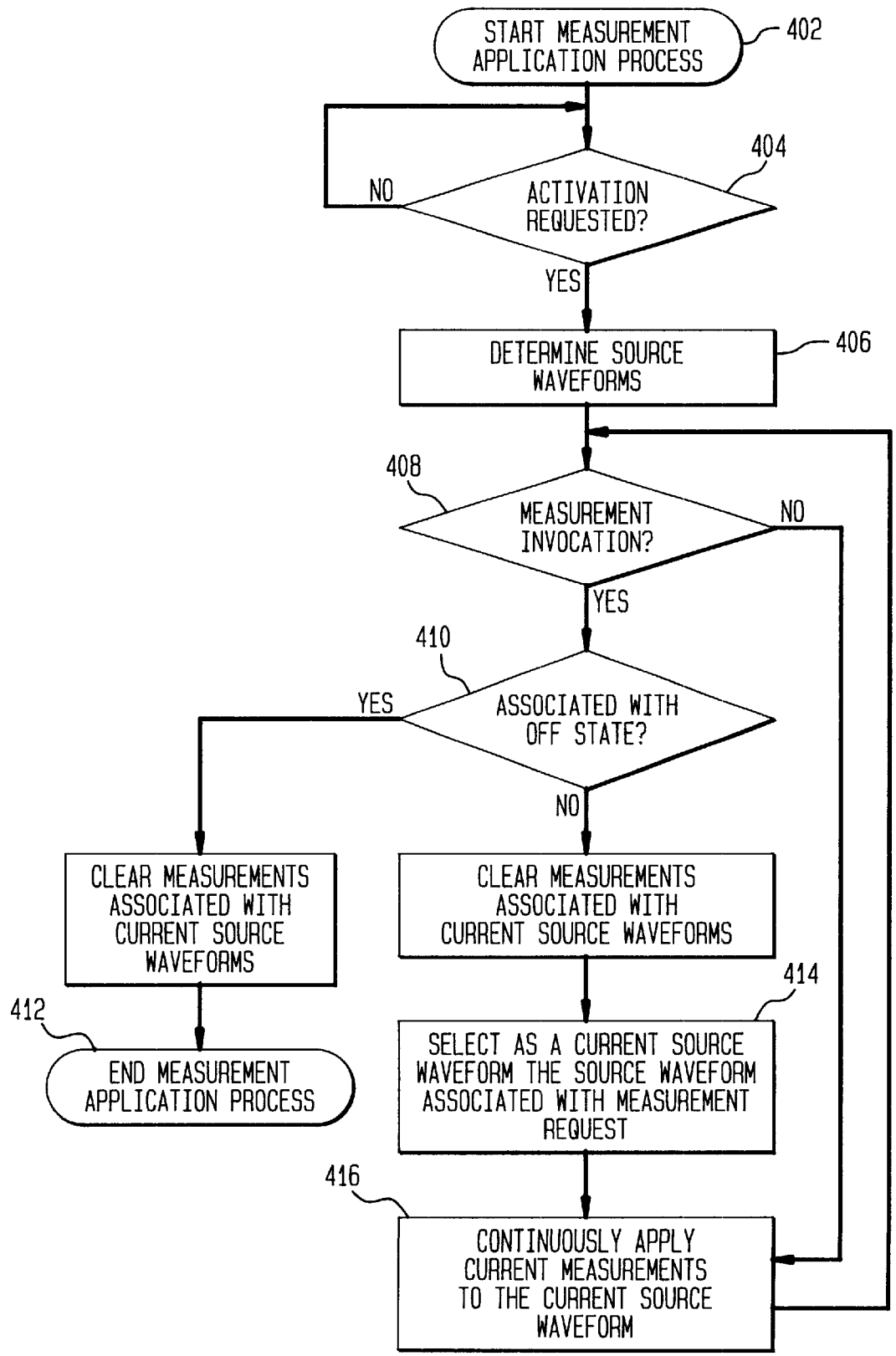
FIG. 4 is a flowchart of one embodiment of the measurement application process of the present invention.

FIG. 4 is a flow chart of one embodiment of the processes performed by the quick measurement system 118 to apply automated measurements to multiple waveforms in accordance with the present invention. After system initialization, the quick measurement system 118 advances from start step 402 to step 404 whereat the quick measurement system 118 monitors the signal measuring system 100 for an activation request 250. As noted, the activation request 250 is generated in response to the user/operator requesting that the quick measurement application process 500 be performed.

Upon activation of the measurement application process 500, the quick measurement system 118 determines, at step 406 which of the active waveforms are to be the source waveforms for this implementation of the measurement application process 500. In one preferred embodiment described above, the quick measurement system 118 accesses the source waveform data structure 208 to determine which of the active waveforms have been selected by the user/operator. In another preferred embodiment, all active waveforms are considered to be source waveforms. That is, the quick measurement system 118 applies the predetermined measurements to all waveforms which are currently active in the signal measuring system in a predetermined sequence. Alternatively, default measurements may be applied until otherwise modified by the user/operator.

At step 408, the quick measurement system 118 determines whether a measurement request 250 has been received. As noted, the measurement request 250 may be generated through the user activating a dedicated button on the front panel keyboard 108 or an element on the graphical user interface 116, depending upon the configuration of the signal measuring system 100 in which the quick measuring system 118 is implemented. If no measurement request 250 has been received, then processing continues at step 416 described below. Alternatively, if a measurement request 250 is detected at step 408, then processing continues at step 410.

As noted, in one preferred embodiment of the quick measurement system 118, each measurement request 250 is sequentially associated with a source waveform and, preferably, the clearing of measurement results. At step 410 the quick measurement system 118 determines whether the measurement request 250 corresponds with the "off" or "no application" state. If so, then the measurements associated with the current source waveforms are cleared at step 411 and the measurement application process 400 cease at stop step 420. Otherwise, the measurement request 250 is associated with one of the source waveforms 258, and processing continues at step 413. At step 413 the measurements for the current source waveform are cleared in preparation for the next measurements.

At step 414, the quick measurement system 118 determines which of the source waveforms 258 is associated with the measurement request 250, the receipt of which was detected at step 408. As noted, in a preferred embodiment described above, the source waveforms 258 are sequentially associated with the measurement request 250. In the embodiment wherein the user/operator selects the sequence in which the source waveforms 258 are measured, the quick measurement system 118 applies the current measurements 260 in the order indicated by the user/operator. Alternatively, the quick measurement system 118 will apply the current measurements 260 to the source waveforms 258 in some predetermined sequence. Once the source waveform which is associated with the measurement request 250 is determined, it is selected as a current source waveform to be measured at step 414.

At step 416, the quick measurement system 118 continuously applies the current measurements 260 to the current source waveforms 258, and displays the results of those measurements in the measurement display region 304 of the display 300.

Processing then continues at step 408 whereat the quick measurement system 118 determines whether another measurement request 250 has been received. Receipt of an additional advance measurement request 251 prompts selection of the source waveform 258 which is associated with the measurement request 250 at step 414 and subsequent invocation of the predetermined current measurements 260 to that source waveform 258 at step 416.

As noted, continuous measurement of the current source waveforms 258 enables the user/operator to continually monitor the characteristics of the selected-waveforms, both visually and numerically, as dynamic changes in the current source waveforms occur.

Figure 5A:
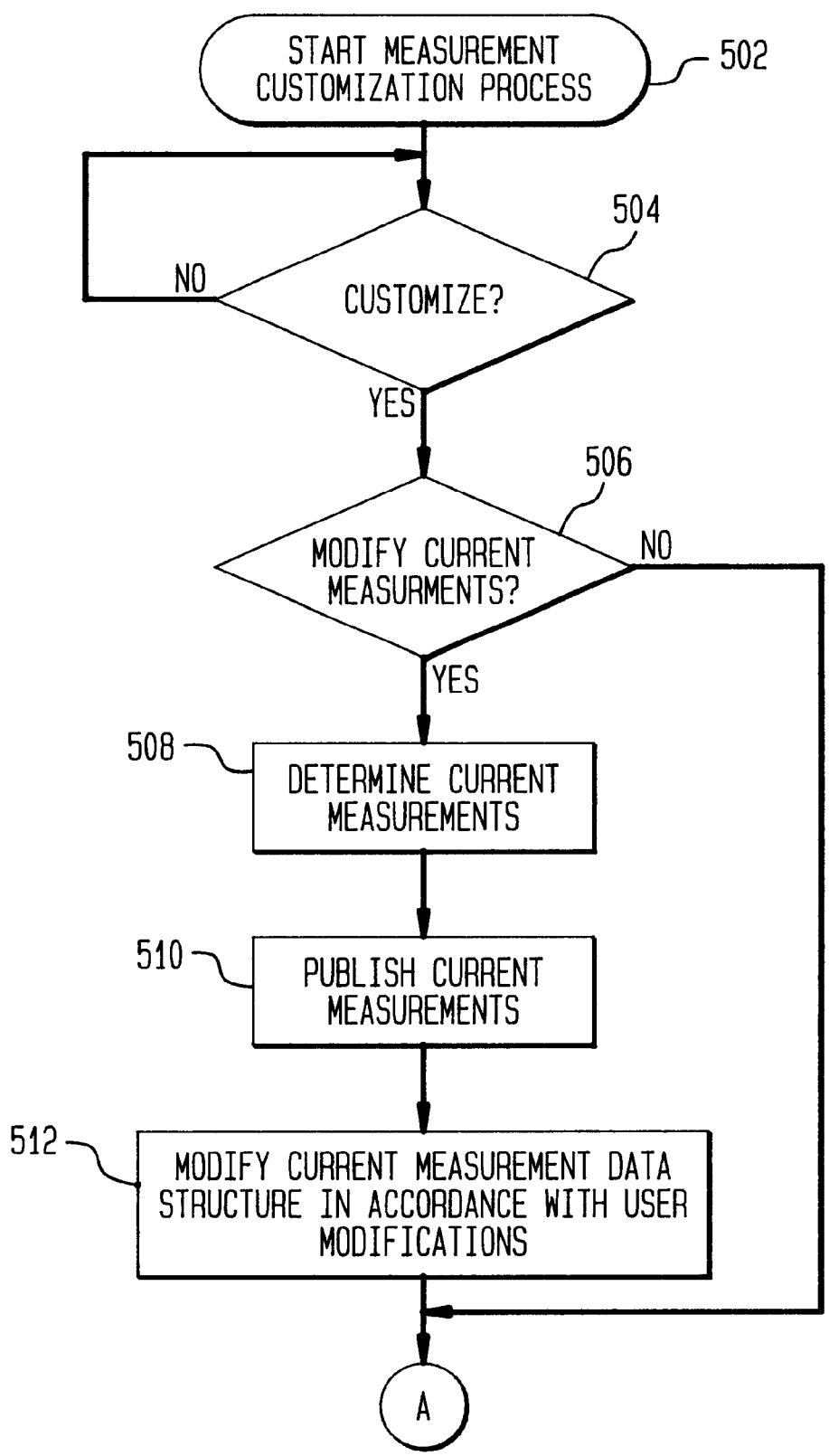
FIGS. 5A and 5B are a flowchart of one embodiment of the measurement customization process of the present invention.
Figure 5B:
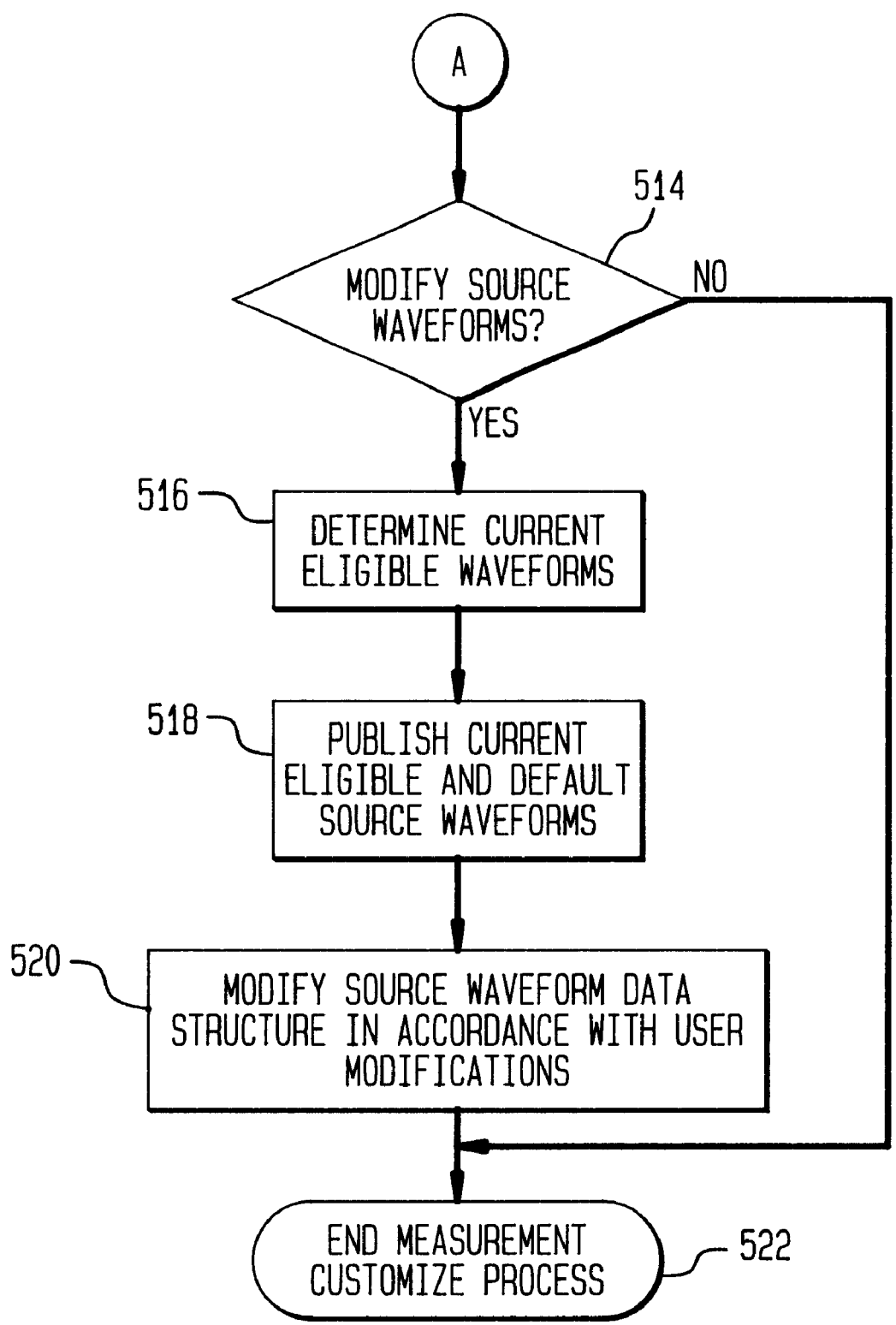

FIGS. 5A and 5B are a flow chart of one embodiment of the measurement customization process 500 of the present invention. After system initialization, the quick measurement system 118 advances from start step 502 to step 504 whereat the quick measurement system 118 monitors the signal measurement system 100 for a customization request 280. As noted, the customization request 280 is generated in response to the user/operator requesting, either through the front panel keyboard 108 or the graphical user interface 116, that the measurement customization process 500 be performed.

At step 506, the quick measurement system 118 determines whether the user/operator has selected the option of modifying the current measurements 260. In one preferred embodiment described above, this is achieved by providing the user with a selectable display element in the graphical user interface 116. Such a display element may be a menu item, icon or other well-known display element. In alternative embodiments, the user/operator may indicate that the current measurements are to be modified by selecting a dedicated button or programmable softkey accessed through the front panel 108. If the user/operator does not indicate that the current measurements are to be modified, then processing continues at step 514 wherein a similar determination is made with respect to the source waveforms 258. Alternatively, the user indicated that the current measurements 260 are to be modified, and processing continues at steps 508 through 512.

The quick measurement system 118 determines the current measurements 260 which are to be applied to the source waveforms 258 at step 508. In the embodiment of the quick measurement system 118 illustrated in FIGS. 2A and 2B, the quick measurement system 118 stores and retrieves this information from the current measurement data structure 210.

Once the current measurements 260 are retrieved from the data structure 210, the quick measurement system 118 publishes them to the user/operator at step 510. As noted, the quick measurement system 118 is preferably implemented in a signal measurement system 100 which includes a graphical user interface 116. In such an embodiment, the quick measurement system 118 generates appropriate commands 274 to the graphical user interface 116 to display an interactive customize quick measurement dialog box 308. As noted, the user/operator may change one or more of the current measurements, preferably by accessing a pull down list 320, with the front panel keyboard 108 or the pointing device 110 in a well-known manner. The user/operator is then able to change the current measurements 260 by selecting from the list or otherwise entering the desired current waveforms in the appropriate current measurement field of dialog box 308.

Once the user closes the interactive dialog box 308, the quick measurement system 118 stores the measurement IDs 228 for the new current measurement, in the current measurement data structure 210 at step 512. The current measurements 260, as modified by the user/operator, are thereafter available for application to the source waveforms 258. As noted above with reference to step 506, if the user/operator indicates that the current measurements 260 are not to be modified, then processing continues at step 514. Likewise, after the current measurements have been modified in accordance with the user's/operator's request, then processing also continues at step 514. At step 514, the quick measurement system 118 determines whether the user/operator has indicated that the source waveforms 258 are to be modified. If so, then processing continues at steps 516 through 520 described below. Otherwise, processing continues at termination step 522 whereat the measurement customization process 500 ceases.

At step 516, the quick measurement system 118 determines the source waveforms 258 which are currently eligible to be measured. In the embodiment of the quick measurement system 118 illustrated in FIGS. 2A and 2B, this information is stored in the source waveform data structure 208. As noted, the source waveform data structure 208 includes the waveform IDs for each of the active waveforms, and an indication of which of these active waveforms are currently source waveforms.

This information is published to the user at step 518. Here, the quick measurement system 118 displays the text associated with the eligible source waveforms in an interactive dialog box through the graphical user interface 116. The user/operator is then able to change the eligible source waveforms 258 as described above.

Once completed, the quick measurement system 118 modifies the source waveform data structure 208 in accordance with the selections made by the user/operator at step 520. The identification of the source waveforms 258, as determined by the user, are thereafter available for use in applying the predetermined measurements. As noted above, in alternative embodiments, all active waveforms are source waveforms. In such an embodiment, steps 514 through 520 may not be performed since all waveforms are to be measured. Alternatively, in such an embodiment, an interactive dialog box may be provided to enable the user to select the sequence in which the source waveforms are measured.

Once the user has modified the current measurements and source waveforms, or has chosen not to make such modifications, then the measurement customization process ceases at termination step 522.

While various embodiments of the present invention have been described above, it should be understood that they have been presented by way of example only, and not limitation. For example, the present invention is preferable implemented in the signal measurement system 100. However, as one skilled in the relevant art would find apparent, the teachings of the present invention may be implemented to enable a user to select and control the functions performed on predetermined entities other than waveforms in systems other than a signal measurement system. It should also be noted that any techniques now or later developed may be used to implement the features of the present invention, such as local or distributed databases for storage of the data structures; the type and format of the data structures, such as linked lists, tables, etc., the manner in which the IDs, status fields and measurement parameters are represented, the manner in which the present invention interfaces with the graphical user interface; the manner in which the information is displayed to the user, etc. Thus, the breadth and the scope of the present invention are not limited by any of the above exemplary embodiments, but are defined only in accordance with the following claims and their equivalents.

What is claimed is:

1. A quick measurement system, for use in a signal measurement system having a display, comprising:

a measurement controller configured to simultaneously apply a plurality of automated measurements to each waveform of a plurality of waveforms, said application of the measurements to each waveform occurring in response to a same operator action, wherein repeated performance of the same operator action with no intervening operator actions results in the sequential measurement of the waveforms; and a measurement customizer configured to enable an operator to select said plurality of automated measurements.

2. The system of claim 1, wherein said signal measurement system further comprises:

a graphical user interface for displaying said plurality of waveforms and measurement results on the display of the signal measurement system, wherein said same operator action comprises selection of a same display element on said graphical user interface.

3. The system of claim 1, wherein said signal measurement system further comprises:

a front panel keyboard, and wherein said same operator action comprises manual activation of a common button on said front panel keyboard.

4. The system of claim 1, wherein the quick measurement system is constructed and arranged such that said sequential association between each performance of the operator action and one of the plurality of waveforms can be specified by the operator.

5. The system of claim 1, wherein said signal measurement system displays a waveform display region on the display, the waveform display region adapted to display said plurality of waveforms, wherein said quick measurement system is further constructed and arranged to display a measurement results display region in which results of said application of the plurality of automated measurements to each of the waveforms are displayed, wherein said measurement display region does not overlay or otherwise visually interfere with the display of waveforms in said waveform display region.

6. A signal measurement system comprising:

a display; and means for simultaneously applying a plurality of user-selected automated measurements to each waveform of a plurality of user-selected waveforms, wherein said application of the measurements to each waveform occurs in response to a same, single operator action, and farther wherein sequential performance of the same operator action causes sequential application of the measurements to each of the plurality of waveforms.

7. The system of claim 6, wherein said signal measurement system includes a graphical user interface, and wherein, said same, single operator action comprises a selection of a display item on said graphical user interface.

8. The system of claim 7, wherein said display item is a pull-down menu item.

9. The system of claim 7, wherein said display item is an icon.

10. The system of claim 6, wherein the signal measurement system includes a control panel, and wherein said same operator action comprises a depression of a button on the control panel of the signal measurement system.

11. The system of claim 7, wherein said activation request is generated in response to a selection of a programmable softkey on the display of the signal measurement system.

12. A method for sequentially applying a plurality of automated measurements to a plurality of waveforms in a signal measurement system having a display, comprising the steps of:

(a) receiving an indication of a first occurrence of an operator action;

(b) applying simultaneously the plurality of automated measurements to a first waveform in response to said first occurrence of said operator action;

(c) displaying results of said step (b) in a specified region of the display;

(d) receiving an indication of a second occurrence of said operator action with no occurrence of any intervening operator action;

(e) applying simultaneously the plurality of automated measurements to a second waveform in response to said second occurrence of said operator action;

(f) displaying results of said step (e) in a specified region of the display.

13. The method of claim 12, further comprising the step of:

(g) prior to said step (a), receiving an indication of which automated measurements have been selected by the user as said plurality of automated measurements to be applied to said first and second waveforms in response to said first and second occurrence of said operator action, respectively.

14. The method of claim 12, further comprising the step of:

(g) prior to said step (a), receiving an indication of which waveforms have been selected by the user as said first and second waveforms.

15. A signal measurement system comprising:

a signal acquisition system;

a display; and a quick measurement system comprising:

an automated measurement manager configured to simultaneously apply a plurality of automated measurements to a waveform, wherein the waveform is one of a plurality of waveforms, and wherein application of said measurements to each of said plurality of waveforms occurs in response to a same operator action, wherein sequential performance of the same operator action with no intervening operator actions results in the sequential measurement of the plurality of waveforms; and an automated measurement customizer configured to enable an operator to determine said plurality of automated measurements.

16. The system of claim 15, wherein said signal measurement system further comprises:

a graphical user interface for displaying said plurality of waveforms and said measurement results on the display of the signal measurement system, wherein said same operator action is a selection of a display element on said display.

17. The system of claim 15, wherein said signal measurement system further comprises a front panel keyboard, and wherein said same operator action is a depression of one dedicated button on the signal measurement system front panel.

18. The system of claim 15, wherein said customizer is further configured to enable an operator to define a sequence in which said one or more automatic measurements are applied to each of said waveforms.

* * * * *